United States Patent [19]
Jeong et al.

[11] Patent Number: 5,621,407
[45] Date of Patent: Apr. 15, 1997

[54] DIGITAL/ANALOG CONVERTER

[75] Inventors: Deog-Kyoon Jeong; Daejeong Kim, both of Seoul, Rep. of Korea

[73] Assignee: Goldstar Electron Co., Ltd., Rep. of Korea

[21] Appl. No.: 370,904

[22] Filed: Jan. 10, 1995

[30] Foreign Application Priority Data

Dec. 3, 1994 [KR] Rep. of Korea ................ 32710-1994

[51] Int. Cl.$^6$ ...................................................... H03M 3/02
[52] U.S. Cl. ............................................. 341/143; 341/150
[58] Field of Search ...................................... 341/143, 150

[56] References Cited

U.S. PATENT DOCUMENTS

| | | | |
|---|---|---|---|
| 5,196,850 | 3/1993 | Duffy et al. | 341/76 |
| 5,412,387 | 5/1995 | Vincelette et al. | 341/150 |
| 5,467,089 | 11/1995 | Draxelmayr | 341/150 |

Primary Examiner—Marc S. Hoff
Attorney, Agent, or Firm—Fleshner & Kim

[57] ABSTRACT

A ΔΣ digital/analog converter comprising an interpolator for sampling an input digital signal at a desired ratio, a noise-shaping coder for quantizing an output signal from the interpolator into the coded bits and modulating a quantization error generated in the quantization, a differentiator for detecting an intersignal variation from an output signal from the noise-shaping coder, the intersignal variation indicating a difference between previous and present digital signal values, a digital logic unit for generating a desired control signal according to the intersignal variation detected by the differentiator, an internal digital/analog converter for performing charging and discharging operations in response to the desired control signal from the digital logic unit to output an analog signal corresponding to the input digital signal, and a filter for filtering an output signal from the internal digital/analog converter to remove a mixed noise therefrom. According to the present invention, a minimized number of passive devices is used to reduce an error amount resulting from a process deviation, miniaturize a chip and easily enhance the internal bits without expanding the chip size.

19 Claims, 3 Drawing Sheets

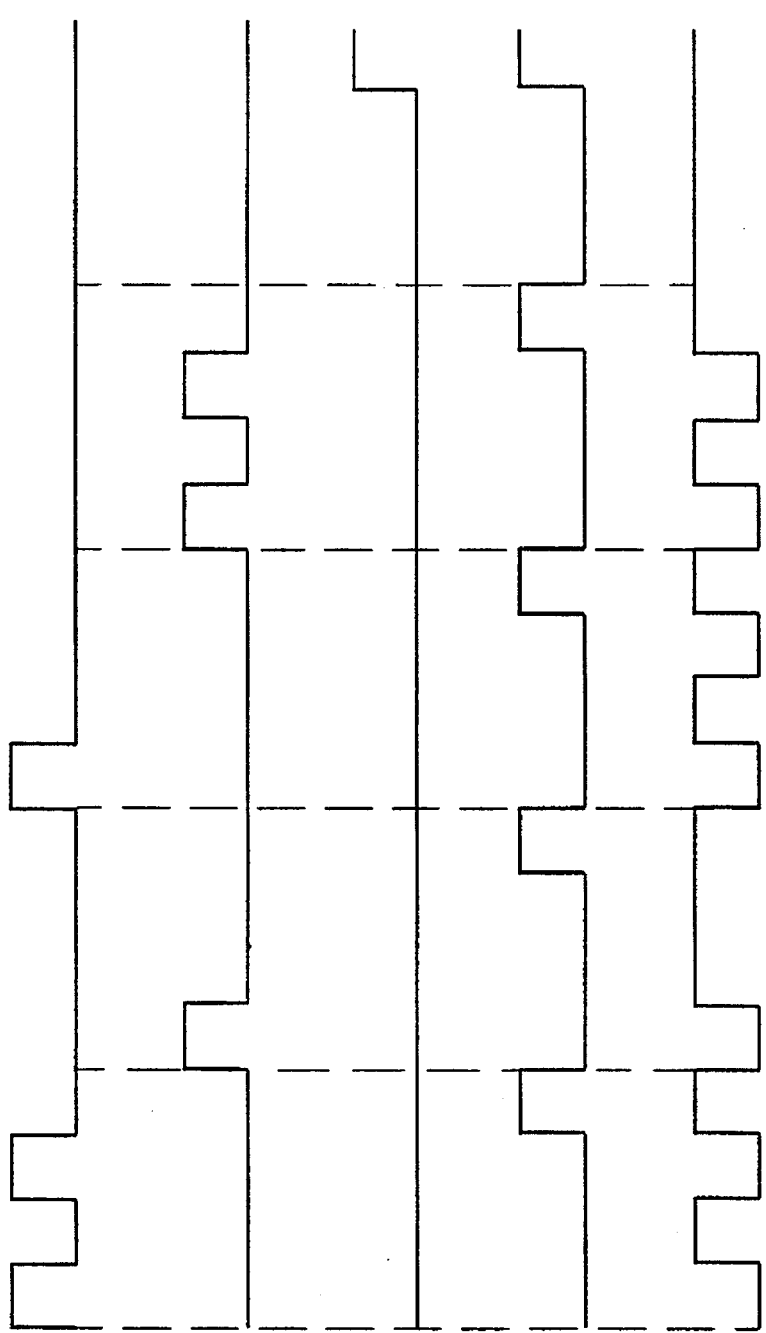
FIG. 5A UP
FIG. 5B DOWN
FIG. 5C REFRESH
FIG. 5D OUT
FIG. 5E DUMP

DIGITAL/ANALOG CONVERTER

BACKGROUND OF THE INVENTION

1. Field of the Invention

The present invention relates in general to ΔΣ digital/analog converters, and more particularly to a ΔΣ digital/analog converter in which a multi-bit internal sub-converter includes a minimized number of passive devices to reduce an error amount resulting from a process deviation, miniaturize a chip and enhance the internal bit extensibility.

2. Description of the Prior Art

In a conventional ΔΣ digital/analog converter, an internal sub-converter which plays the key role in determining the overall resolution includes a plurality of passive devices in order to employ the so-called dynamic matching method. A different combination of the passive devices is selected at every signal conversion according to a pseudo random rule in order to generate a white noise in the internal sub-converter. For example, a 3-bit internal sub-converter includes eight passive devices. A different combination of the eight passive devices in the 3-bit internal sub-converter is selected to output an analog signal corresponding to the input digital signal. For example, assume that two of the eight passive devices are selected. In this case, rather than selecting two specific passive devices, random passive devices such as the first and second passive devices or the first and third passive devices are selected. As a result, when the number of internal bits is n, the possible number of combinations of the passive devices required to embody the internal sub-converter are theoretically $(2^n)!$.

In practice, the internal sub-converter employs a butterfly randomizer as shown in FIG. 1 to reduce a burden on the hardware. The butterfly randomizer includes a series of switching connections in the form of a butterfly between input devices and the output terminal. FIG. 1 is the view illustrating the combinations of the passive devices in the 3-bit internal sub-converter employing the butterfly randomizer. In FIG. 1, the left reference numerals 0–7 designate the passive devices, respectively, and the right reference numerals 0–7 designate output values of the analog signal, respectively. Also, the reference numerals S1–S12 designate switches, respectively. For example, assume that the passive device of No. 1 and the passive device of No. 3 are selected in such a manner that the output value of the analog signal can become 2. In this case, the No. 1 passive device follows a path of switch S1 ON→switch S5 ON→switch S11 OFF and the No. 3 passive device follows a path of switch S2 ON→switch S5 OFF→switch S11 OFF. Here, it is assumed that a diagonal direction is selected if the switch is ON, whereas a straight direction is selected if the switch is OFF.

The above-mentioned conventional ΔΣ digital/analog converter which employs a dynamic matching method has a disadvantage of the hardware complexity for whitening the noise of the random process variation.

SUMMARY OF THE INVENTION

Therefore, the present invention has been made in view of the above problem, and it is an object of the present invention to provide a ΔΣ digital/analog converter in which a minimized number of passive devices are used to reduce an error amount resulting from a process deviation, miniaturize a chip and enhance the internal bit extensibility.

In accordance with the present invention, the above and other objects can be accomplished by a provision of a ΔΣ digital/analog converter comprising interpolation means for sampling an input digital signal at a desired ratio; noise-shaping coding means for quantizing an output signal from said interpolation means in the unit of desired bits and modulating a quantization error generated in the quantization; differentiating means for detecting an intersignal variation from an output signal from said noise-shaping coding means, said intersignal variation indicating a difference between previous and present digital signal values; digital logic means for generating a desired control signal according to the intersignal variation detected by said differentiating means; internal digital/analog conversion means for performing charging and discharging operations in response to the desired control signal from said digital logic means to output an analog signal corresponding to the input digital signal; and filtering means for filtering an output signal from said internal digital/analog conversion means to remove a mixed noise therefrom.

BRIEF DESCRIPTION OF THE DRAWINGS

The above and other objects, features and advantages of the present invention will be more clearly understood from the following detailed description taken in conjunction with the accompanying drawings, in which:

FIGS. 5A to 5E are timing diagrams of signals from a digital logic unit in FIG. 2.

DETAILED DESCRIPTION OF THE PREFERRED EMBODIMENTS

Figure 1:
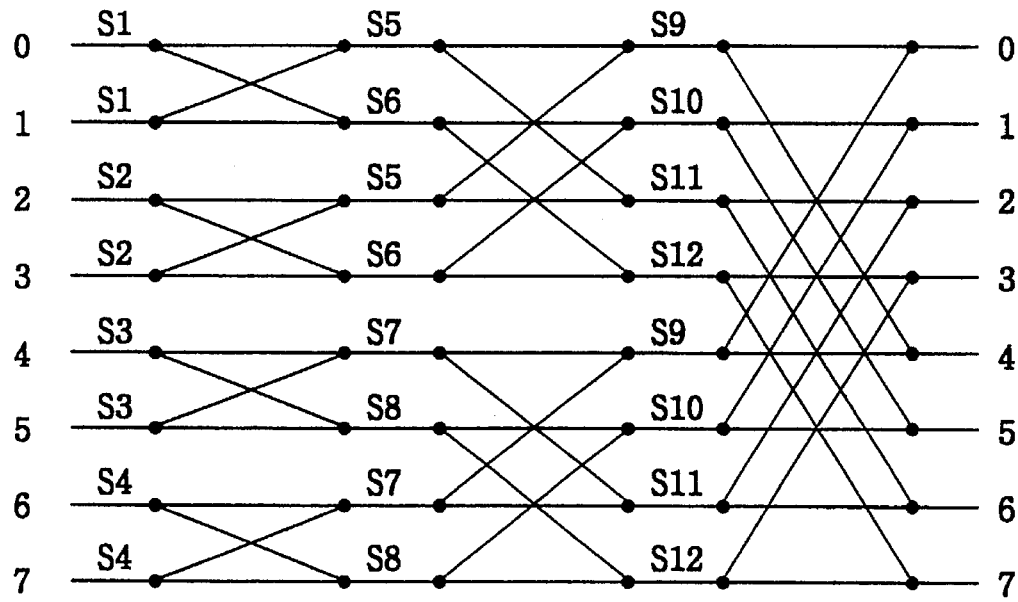
FIG. 1 is a view illustrating a relationship between passive devices and output values in a 3-bit internal sub-converter of a conventional ΔΣ digital/analog converter employing a butterfly randomizer.
Figure 2:
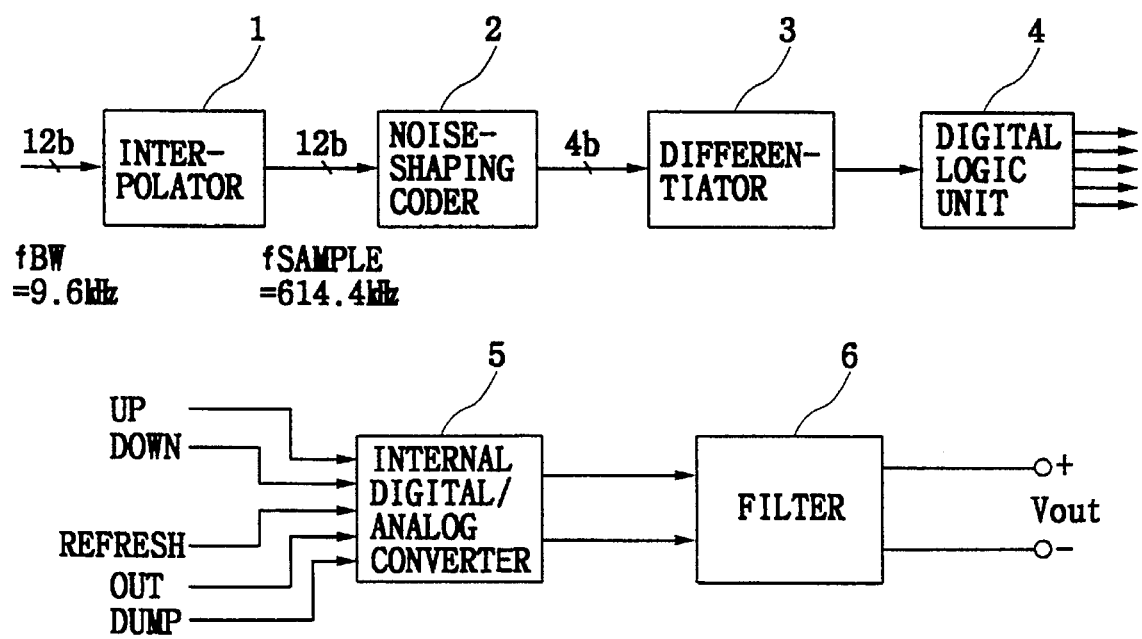
FIG. 2 is a block diagram of a ΔΣ digital/analog converter in accordance with the present invention.

Referring to FIG. 2, there is shown a block diagram of a ΔΣ digital/analog converter in accordance with the present invention. As shown in this drawing, the ΔΣ digital/analog converter comprises an interpolator 1 for oversampling an input digital signal, a noise-shaping coder 2 for quantizing an output signal from the interpolator 1 in the unit of desired bits and converging a quantization noise power generated in the quantization to the high frequency beyond the signal band, a differentiator 3 for detecting an intersignal variation of the output signal from the noise-shaping coder 2, a digital logic unit 4 for generating up, down, refresh and out signals according to the intersignal variation detected by the differentiator 3, an internal digital/analog converter 5 for outputting an analog signal corresponding to the input digital signal in response to the up, down, refresh and out signals from the digital logic unit 4, and a filter 6 for filtering out an output signal from the internal digital/analog converter 5 to remove a mixed noise therefrom.

The operation of the ΔΣ digital/analog converter with the above-mentioned construction in accordance with the present invention will hereinafter be described in detail.

Upon receiving the input digital signal, the interpolator 1 samples the input digital signal at a desired ratio. For example, in FIG. 2, a 12-bit digital signal with a frequency bandwidth of 9.6KHz is oversampled into that with a sampling frequency of 614.4KHz by the interpolator 1. In this case, the oversampling ratio (OSR) is 64.

The noise-shaping coder 2 quantizes the output signal from the interpolator 1 in the unit of the desired bits and modulates the quantization noise generated in the quantization. For example, in FIG. 2, the 12-bit digital signal is processed in the unit of 4 bits by the noise-shaping coder 2. As a result, the noise-shaping coder 2 outputs a 4-bit internal digital signal to the differentiator 3.

Figure 3:
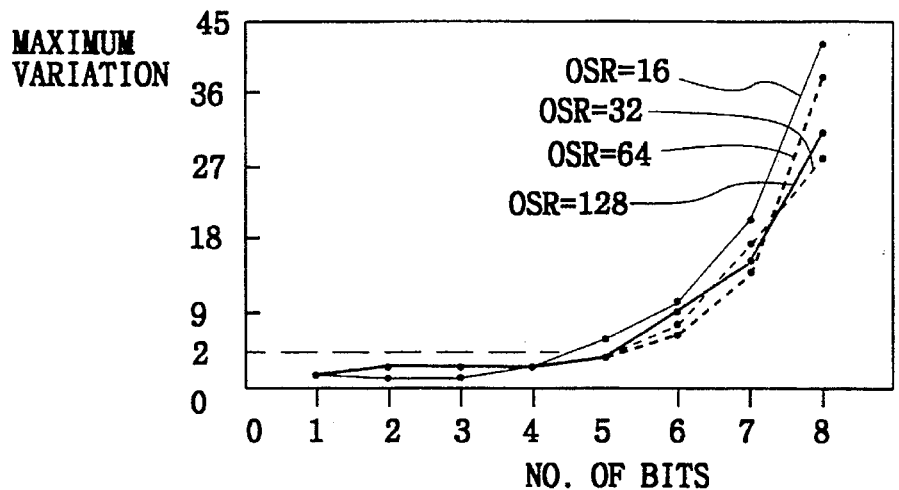
FIG. 3 is a graph illustrating a maximum intersignal variation of the output signal from the noise-shaping coder in FIG. 2 in the case where an oversampling ratio is a parameter and the number of internal bits is the independent variable.

The differentiator 3 detects the intersignal variation of the output signal from the noise-shaping coder 2. The intersignal variation signifies a difference between the previous and present digital signals. The intersignal variation detected by the differentiator 3 is reduced as the oversampling ratio in the interpolator 1 becomes higher. FIG. 3 is a graph illustrating the relationship between a maximum intersignal variation detected by the differentiator 3 and the number of bits processed in the differentiator 3 in the case where the oversampling ratio is a parameter. In FIG. 3, the maximum intersignal variation signifies an absolute value because it can be increased or reduced. As seen from FIG. 3, in the case where the number of bits processed in the noise-shaping coder 2 is 4, the intersignal variation does not exceed 2 when the oversampling ratio is 16 or more. As a result, because the intersignal variation is small, a very short time is required in performing the internal digital/analog conversion operation based on the intersignal variation.

Then, the digital logic unit 4 generates the up, down, refresh and out signals according to the intersignal variation detected by the differentiator 3 and outputs the generated up, down, refresh and out signals to the internal digital/analog converter 5. The internal digital/analog converter 5 outputs the analog signal corresponding to the input digital signal in response to the up, down, refresh and out signals from the digital logic unit 4, which will hereinafter be described in more detail with reference to Figs. 4 and 5E.

Figure 4:
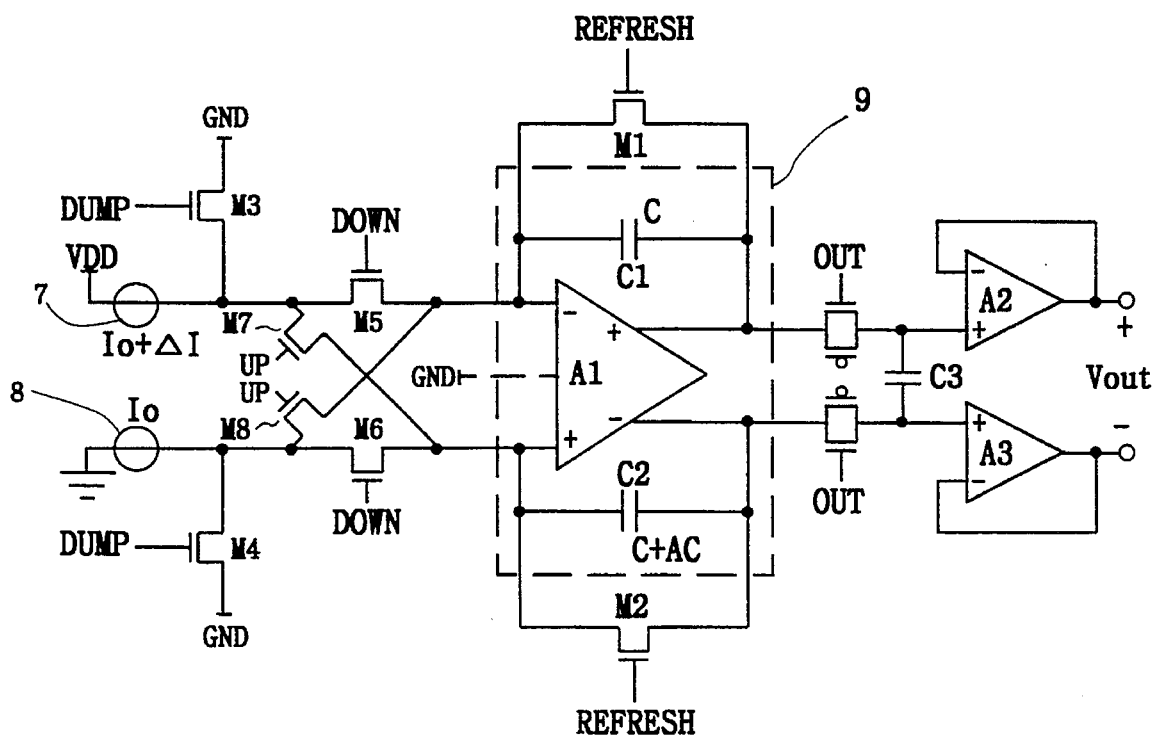
FIG. 4 is a detailed circuit diagram of an internal digital/analog converter in FIG. 2.

Referring to FIG. 4, there is shown a detailed circuit diagram of the internal digital/analog converter 5 in FIG. 2. As shown in this drawing, the internal digital/analog converter 5 includes a current source 7 having one terminal connected to a supply voltage source $V_{DD}$ and the other terminal connected to one terminal of a dump transistor M3, an up transistor M7 and a down transistor M5. The dump transistor M3, the up transistor M7 and the down transistor M5 are switched in response to a dump signal and the up and down signals from the digital logic unit 4, respectively. The internal digital/analog converter 5 also includes a current sink 8 having one terminal connected to a ground terminal and the other terminal connected to one terminal of a dump transistor M4, an up transistor M8 and a down transistor M6. The dump transistor M4, the up transistor M8 and the down transistor M6 are switched in response to the dump, up and down signals from the digital logic unit 4, respectively.

Further, the internal digital/analog converter 5 includes an integrator 9 for performing an integrating operation. The integrator 9 includes an operational amplifier A1, and capacitors C1 and C2. The capacitor C1 is connected between an inverting input terminal and a non-inverting output terminal of the operational amplifier A1. The capacitor C2 is connected between a non-inverting input terminal and an inverting output terminal of the operational amplifier A1. The inverting input terminal of the operational amplifier A1 is connected in common to the other terminals of the down transistor M5 and the up transistor M8. The non-inverting input terminal of the operational amplifier A1 is connected in common to the other terminals of the down transistor M6 and the up transistor M7. A refresh transistor M1 is connected in parallel to the capacitor C1 to refresh it. A refresh transistor M2 is connected in parallel to the capacitor C2 to refresh it. A transmission gate T1 is connected to the non-inverting output terminal of the operational amplifier A1 to transfer an output signal therefrom in response to the out signal from the digital logic unit 4. A transmission gate T2 is connected to the inverting output terminal of the operational amplifier A1 to transfer an output signal therefrom in response to the out signal from the digital logic unit 4. An operational amplifier A2 has a non-inverting input terminal for inputting an output signal from the transmission gate T1 with an inverting input terminal and an output terminal connected to each other. An operational amplifier A3 has a non-inverting input terminal for inputting an output signal from the transmission gate T2 with an inverting input terminal and an output terminal connected to each other. A capacitor C3 is connected between output terminals of the transmission gates T1 and T2 to minimize a signal dependent error based on a redistributed charge appearing when the transmission gates T1 and T2 are turned off.

On the other hand, the current source 7 and the current sink 8 may be substituted with a desired capacitor which stores a unit charge as high and low voltages are applied at both sides thereof, respectively. Also, the capacitor outputs the stored unit charge as it is inverted in polarity by switches operating respectively in response to the up and down signals from the digital logic unit 4.

The integrator 9 may further include an offset removing capacitor connected to the input stage of the operational amplifier A1 to generate an offset removing signal before the refresh signal is made active, so as to remove perfectly an offset voltage generated in the operational amplifier A1.

Now, the operation of the internal digital/analog converter 5 with the above-mentioned construction will be mentioned in more detail.

First, when the intersignal variation detected by the differentiator 3 is a positive number, the digital logic unit 4 generates the up signal with pulses of the number corresponding to the detected intersignal variation. Then, the digital logic unit 4 outputs the generated up signal to the internal digital/analog converter 5. In the internal digital/analog converter 5, the up signal from the digital logic unit 4 is applied to gates of the up transistors M7 and M8, thereby causing the up transistors M7 and M8 to be turned on. With the up transistor M7 turned on, a current (Io+ΔI) from the current source 7 is charged on the capacitor C2. With the up transistor M8 turned on, a charge stored on the capacitor C1 is discharged due to a current Io from the current sink 8. As a result, a voltage variation ΔVup in the integrator 9 increased as the up signal from the digital logic unit 4 is applied can be expressed by the following equation:

$$\Delta Vup=[(Io+\Delta I)/(C+\Delta C)+Io/C]\tau$$

where, τ is an up pulse ON time, ΔI is a current error resulting from a process deviation and ΔC is a capacitance error resulting from the process deviation.

On the other hand, if the intersignal variation detected by the differentiator 3 is a negative number, the digital logic unit 4 generates the down signal with pulses of the number corresponding to the absolute value of the detected intersignal variation. Then, the digital logic unit 4 outputs the generated down signal to the internal digital/analog converter 5. In the internal digital/analog converter 5, the down signal from the digital logic unit 4 is applied to gates of the down transistors M5 and M6, thereby causing the down transistors M5 and M6 to be turned on. As the down transistor M5 is turned on, the current (Io+ΔI) from the current source 7 is charged on the capacitor C1. With the down transistor M6 turned on, a charge stored on the capacitor C2 is discharged due to the current Io from the current sink 8. As a result, a voltage variation ΔVdown in the integrator 9 increased as the down signal from the digital logic unit 4 is applied can be expressed by the following equation:

$$\Delta Vdown = [(Io+\Delta I)/C + Io/(C+\Delta C)]\tau$$

where, τ is a down pulse ON time.

The dump signal is obtained by NORing the up signal and the down signal. The dump signal is applied to the transistors M3 and M4 to turn on them when no charge is supplied to the integrator 9, namely, both the up and down signals are "0" in logic. As being turned on, the transistors M3 and M4 cause the current (Io+ΔI) from the current source 7 and the current Io from the current sink 8 to flow to the ground terminal.

When the charge is accumulated in the integrator 9 as mentioned above, the transmission gates T1 and T2 are turned on upon receiving the out signal from the digital logic unit 4. As the transmission gates T1 and T2 are turned on, the output signals from the integrator 9 are applied respectively to the non-inverting input terminals of the operational amplifiers A2 and A3 which are output buffers. In result, a voltage Vout between the output terminals of the operational amplifiers A2 and A3 becomes the analog signal corresponding to the input digital signal. Here, the capacitor C3 connected between the output terminals of the transmission gates T1 and T2 acts to minimize the effect of the redistributed charge appearing when the transmission gates T1 and T2 are turned off.

Then, the filter 6 filters the output signal from the internal digital/analog converter 5 to remove the mixed noise therefrom.

By the way, the error resulting from leakage charge is continuously accumulated on the capacitors C1 and C2 during the operation of the integrator 9. For this reason, a refresh operation must be performed to allow the error charges accumulated on the capacitors C1 and C2 to be intermittently discharged. For this end, the digital logic unit 4 generates the refresh signal. The digital logic unit 4 generates the refresh signal when the output signal from the noise-shaping coder 2 has a specified code. In accordance with the preferred embodiment of the present invention, the output signal from the noise-shaping coder 2 has all codes of "0" and positive and negative numbers around "0", and the digital logic unit 4 generates the refresh signal when the output signal from the noise-shaping coder 2 becomes "0". This reason is that the refresh operation can most frequently be performed because the output signal from the noise-shaping coder 2 becomes "0" with the highest frequency.

When the refresh signal is generated from the digital logic unit 4, it is applied to gates of the refresh transistors M1 and M2 connected in parallel, respectively, to the capacitors C1 and C2, thereby causing the refresh transistors M1 and M2 to be turned on. As a result, the error charges stored on the capacitors C1 and C2 are discharged through the turned-on refresh transistors M1 and M2, respectively. Therefore, the leakage current error is removed, so that the operation can be performed stably.

FIGS. 5A to 5E are timing diagrams illustrating examples of the output signals from the digital logic unit 4 in FIG. 2. For example, in the case where the number of bits processed in the noise-shaping coder 2 is 4, the intersignal variation is 2 at the maximum. As a result, the out signal is generated every two digital/analog conversion cycles as shown in FIG. 5D. The out signal is generated during the latter half of the second one of the two digital/analog conversion cycle. FIGS. 5A and 5B show examples of the up and down signals generated according to the intersignal variation detected by the differentiator 3. In FIG. 5A, the generation of the two up pulses for the first two digital/analog conversion cycles signifies that the intersignal variation detected by the differentiator 3 is +2. In FIG. 5B, the generation of the one down pulse for the second two digital/analog conversion cycles signifies that the intersignal variation detected by the differentiator 3 is −1. The refresh signal is generated when the code of the output signal from the noise-shaping coder 2 is "0". As shown in FIG. 5C, the refresh signal is generated in the latter half of the second one of the two digital/analog conversion cycles. The dump signal is generated to allow the currents from the current source 7 and the current sink 8 to flow to the ground terminal when no charge is supplied to the integrator 9. As shown in FIG. 5E, the dump signal is obtained by NORing the up and down signals as shown in FIGS. 5A and 5B.

As apparent from the above description, according to the present invention, the passive devices are used to reduce significantly the error resulting from the process deviation as well as the integration capacitance error. Also, the used passive devices are small in number, resulting in a reduction in the chip size. Further, the intersignal variation is reduced as the oversampling ratio becomes higher. In this connection, although the internal bits are extended in number, little variation is in the number of the data conversion cycles and the complexity of the hardware. Therefore, the ΔΣ digital/analog converter of the present invention has the effect of enhancing significantly the internal bit extensibility.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A ΔΣ digital/analog converter comprising:

interpolation means for sampling an input digital signal at a desired ratio;

noise-shaping coding means for quantizing an output signal from said interpolation means into coded bits and modulating a quantization error generated in the quantization;

differentiating means for detecting an intersignal variation of the output signal from said noise-shaping coding means, said intersignal variation indicating a difference between previous and present digital signal values;

digital logic means for generating control signals according to the intersignal variation detected by said differentiating means;

internal digital/analog conversion means for performing charging and discharging operations in response to the control signals from said digital logic means to output an analog signal corresponding to the input digital signal; and filtering means for filtering an output signal from said internal digital/analog conversion means to remove a mixed noise therefrom.

2. A ΔΣ digital/analog converter as set forth in claim 1, wherein said control signals from said digital logic means includes an up signal generated when the intersignal variation detected by said differentiating means is a positive number, said up signal having pulses of the number corresponding to the intersignal variation, a down signal generated when the intersignal variation detected by said differentiating means is a negative number, said down signal having pulses of the number corresponding to an absolute value of the intersignal variation, and an out signal generated to allow said internal digital/analog conversion means to output the analog signal at a desired cycle.

3. A ΔΣ digital/analog converter as set forth in claim 2, wherein said control signals from said digital logic means further includes a dump signal generated to allow a charge to be charged or discharged in said internal digital/analog conversion means when said up and down signals are at a desired logic state.

4. A ΔΣ digital/analog converter as set forth in claim 3, wherein said dump signal is obtained by NORing said up and down signals.

5. A ΔΣ digital/analog converter as set forth in claim 2, wherein said control signals from said digital logic means further includes a refresh signal generated in the latter half of a last one of internal digital/analog conversion cycles when the output signal from said noise-shaping coding means has a desired code value, to refresh said internal digital/analog conversion means.

6. A ΔΣ digital/analog converter as set forth in claim 5, wherein said desired code value is one of output codes from said noise-shaping coding means with the highest frequency.

7. A ΔΣ digital/analog converter as set forth in claim 2, wherein said out signal is generated in the latter half of a last one of internal digital/analog conversion cycles of the number equal to a maximum intersignal variation detected by said differentiating means.

8. A ΔΣ digital/analog converter as set forth in claim 1, wherein said internal digital/analog conversion means includes:

a first current source for generating a positive unit charge;

a second current source for generating a negative unit charge;

an integrator including an operational amplifier and first and second capacitors, said first capacitor being connected between an inverting input terminal and a non-inverting output terminal of said operational amplifier, said second capacitor being connected between a non-inverting input terminal and an inverting output terminal of said operational amplifier;

first down switching means connected between said first current source and said inverting input terminal of said operational amplifier, said first down switching means being switched in response to a down signal from said digital logic means;

first up switching means connected between said first current source and said non-inverting input terminal of said operational amplifier, said first up switching means being switched in response to an up signal from said digital logic means;

second up switching means connected between said second current source and said inverting input terminal of said operational amplifier, said second up switching means being switched in response to the up signal from said digital logic means;

second down switching means connected between said second current source and said non-inverting input terminal of said operational amplifier, said second down switching means being switched in response to the down signal from said digital logic means;

a first transmission gate for controlling the transfer of an output signal from said non-inverting output terminal of said operational amplifier in response to an out signal from said digital logic means;

a second transmission gate for controlling the transfer of an output signal from said inverting output terminal of said operational amplifier in response to the out signal from said digital logic means;

a first buffer for transferring an output signal from said first transmission gate externally; and a second buffer for transferring an output signal from said second transmission gate externally.

9. A ΔΣ digital/analog converter as set forth in claim 8, wherein said second current source is a current sink.

10. A ΔΣ digital/analog converter as set forth in claim 8, wherein said internal digital/analog conversion means includes a switched capacitor instead of said first and second current sources, said switched capacitor storing a unit charge as high and low voltages is applied at both sides thereof, respectively, and outputting the stored unit charge by switches operated respectively in response to the up and down signals from said digital logic means.

11. A ΔΣ digital/analog converter as set forth in claim 8, wherein said internal digital/analog conversion means further includes:

first dump switching means connected to said first current source, said first up switching means and said first down switching means, said first up switching means and said first down switching means to supply the positive unit charge from said first current source to said integrator for a predetermined time period in response to a dump signal from said digital logic means; and second dump switching means connected to said second current source, said second up switching means and said second down switching means to supply the positive unit charge from said first current source to said integrator for the predetermined time period in response to the dump signal from said digital logic means.

12. A ΔΣ digital/analog converter as set forth in claim 8, wherein said integrator further includes:

first refresh switching means connected in parallel to said first capacitor to refresh it in response to a refresh signal from said digital logic means; and second refresh switching means connected in parallel to said second capacitor to refresh it in response to the refresh signal from said digital logic means.

13. A converter for a sigma delta digital/analog converter, which is responsive to control signals, comprising:

a plurality of current sources for generating at least one of positive and negative unit charges;

an integrator including an operational amplifier having a plurality of input and output terminals and a plurality of capacitors coupled between input and output terminals of said operational amplifier;

a plurality of first transistors coupled between said plurality of current sources and input terminals of said operational amplifier and being responsive to the control signals;

a first transmission gate coupled to one of said output terminals of said operational amplifier; and a first buffer coupled to said first transmission gate.

14. The converter of claim 13 further comprising:

second transmission gate coupled to another output terminal of said operational amplifier; and a second buffer coupled to said second transmission gate.

15. The converter of claim 13, wherein said plurality of current sources comprises:

a first current source for generating a positive unit charge; and a second current source for generating a negative unit charge.

16. The converter of claim 15, wherein said plurality of first transistors comprises:

a first down transistor coupled between said first current source and a first input terminal of said plurality of input terminals and being responsive to a down signal of said control signals; and a first up transistor connected between said first current source and a second input terminal of said plurality of input terminals and being responsive to an up signal of said control signals.

17. The converter of claim 16, wherein said plurality of first transistors further comprises:

a second up transistor connected between said second current source and said first input terminal and being responsive to the up signal; and a second down transistor connected between said second current source and said second input terminal and being responsive to said down signal.

18. The converter of claim 13, further comprises a plurality of second transistors coupled between input and output terminals of said operational amplifier and being responsive to said control signals.

19. The converter of claim 13, further comprising:

a first dump transistor connected to corresponding one of said plurality of current sources and first transistors to supply positive unit charge to said integrator for a first predetermined period of time in response to a corresponding control signal; and a second dump transistor connected to corresponding current source and first transistor to supply positive unit charge to said integrator for a second predetermined period of time in response to a corresponding control signal.

* * * * *